United States Patent
Schmid et al.

(10) Patent No.: US 7,239,162 B2
(45) Date of Patent: *Jul. 3, 2007

(54) DEVICE FOR MEASUREMENT AND ANALYSIS OF ELECTRICAL SIGNALS OF AN INTEGRATED CIRCUIT COMPONENT

(75) Inventors: Wilhelm Schmid, Ingolstadt (DE); Carsten Dörrhöfer, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/028,728

(22) Filed: Jan. 4, 2005

(65) Prior Publication Data

US 2005/0116732 A1  Jun. 2, 2005

Related U.S. Application Data

(60) Division of application No. 11/000,616, filed on Nov. 30, 2004, now abandoned, which is a division of application No. 09/740,634, filed on Dec. 18, 2000, now Pat. No. 6,949,940, which is a continuation of application No. PCT/DE99/01719, filed on Jun. 11, 1999.

(30) Foreign Application Priority Data

Jun. 16, 1998 (DE) ................... 198 26 825

(51) Int. Cl.
*G01R 31/02* (2006.01)

(52) U.S. Cl. ........................ 324/763; 324/765

(58) Field of Classification Search ...................... None
See application file for complete search history.

(56) References Cited

U.S. PATENT DOCUMENTS

| | | |
|---|---|---|
| 3,807,910 A | 4/1974 | Quinn |
| 4,982,403 A | 1/1991 | Du Chene et al. |
| 5,418,470 A | 5/1995 | Dagostino et al. |
| 5,712,858 A | 1/1998 | Godiwala et al. |
| 5,895,978 A | 4/1999 | Palagonia |

(Continued)

FOREIGN PATENT DOCUMENTS

EP    0 650 069 A2    4/1995

(Continued)

OTHER PUBLICATIONS

"IEEE Standard Test Access Port and Boundary-Scan Architecture" 1149.1-1990 ISBN 1-55937-350-4, published 1993.

*Primary Examiner*—Paresh Patel
(74) *Attorney, Agent, or Firm*—Laurence A. Greenberg; Werner H. Stemer; Ralph E. Locher

(57) ABSTRACT

According to the invention, one or more external test connection contact points (pads; pins; balls), are provided in an integrated circuit component (chip) (1), through which signals (4, 5, 6) that are to be measured or analyzed are selectively fed, e.g. by means of a multiplex circuit (7,8), and wherein the signals may be connected by means of routes located internally in the component from switch points that are not directly accessible, e.g. points inside the chip (15 to 20) or covered contact points. The device according to the invention is particularly useful for highly integrated semiconductor chips.

13 Claims, 4 Drawing Sheets

U.S. PATENT DOCUMENTS

| | | | |
|---|---|---|---|
| 5,909,004 A * | 6/1999 | Hedengren et al. | 136/201 |
| 6,084,174 A * | 7/2000 | Hedengren et al. | 136/201 |
| 6,127,729 A * | 10/2000 | Fukuda | 257/736 |
| 6,180,867 B1 * | 1/2001 | Hedengren et al. | 136/201 |

FOREIGN PATENT DOCUMENTS

| | | |
|---|---|---|
| JP | 61 228 365 A | 10/1986 |
| JP | 04 076 474 A | 3/1992 |

\* cited by examiner

DEVICE FOR MEASUREMENT AND ANALYSIS OF ELECTRICAL SIGNALS OF AN INTEGRATED CIRCUIT COMPONENT

CROSS-REFERENCE TO RELATED APPLICATIONS

This is a division of copending application Ser. No. 11/000,616, filed Nov. 30, 2004 ABN, which is a division of application Ser. No. 09/740,634, filed Dec. 18, 2000 U.S. Pat. No. 6,949,940; which was a continuing application, under 35 U.S.C. §120, of International application PCT/DE99/01719, filed Jun. 11, 1999; the application also claims the priority, under 35 U.S.C. §119, of German patent application No. 198 26 825.4, filed Jun. 16, 1998; the prior applications are herewith incorporated by reference in their entirety.

BACKGROUND OF THE INVENTION

Field of the Invention

The invention relates to a device for electrical measurement and analysis of electrical signals which are present at circuit points that are not directly accessible in an integrated circuit component (IC; integrated circuit; chip) which is provided with a large number of connecting contact points (pads; pins; balls).

In order to allow malfunctions and clock concepts to be analyzed on integrated circuit components, it is necessary to monitor internal-chip signals, that is to say signals which are present at inaccessible circuit points within the integrated circuit component. In this case, accurate timing of the signal monitoring is very frequently important. For example, to do this, clocks must be measured with respect to one another, asynchronous signals such as interrupts must be measured, and functions must be analyzed as a function of asynchronous signals.

Previous analysis methods have used special analysis equipment which is technically extremely complex and is therefore also very expensive. For such analysis, the integrated circuit component must be opened, and must be prepared for the measurements. However, these measures change the electrical response of the circuit and, in some cases, it is no longer possible to reproduce faults.

Inaccessible circuit points can also result from the definition and design of integrated circuit components. When, for example, integrated circuits are mounted in the new, so-called BGA (ball grid array) packages, and are then mounted on a system board in the system, then the contact points (balls) on the BGA package are no longer accessible to the system board since the contact points are located on the lower face of the package and are thus concealed between the package and the system board. It is thus no longer possible to tap off the signals at the contact points for analysis and test purposes. This problem does not occur, for example, when TQPF packages are used for integrated semiconductor circuits, since the signals can also be tapped off directly at the pins in the system.

In the case of BGA packages, on the other hand, the most important signals are routed to test points on the system board, and are routed from there to the connected chip. First, this costs space on the respective system board, and this is necessarily associated with additional costs, and, second, it results in additional complexity for signal extraction, for which the corresponding signals must first be routed to the surface of the printed circuit board, which in some cases is a multilayer board. For these reasons, only a very small number of signals are routed to test points, which means that, in the event of a fault, it is often impossible to tap off just the desired signal.

SUMMARY OF THE INVENTION

It is accordingly an object of the invention to provide an apparatus providing a technically less complex solution for allowing those signals which are present at inaccessible circuit points in an integrated circuit component, for example internal-chip signals or all the signals, to be monitored at the contact points of an integrated semiconductor circuit which is enclosed in a BGA package, so that tests and analysis can be carried out easily even in mass-produced products that have become well known.

With the foregoing and other objects in view there is provided, in accordance with the invention an integrated circuit component that includes a plurality of connecting contact points; a plurality of circuit points that are not externally accessible and that provide electrical signals to be measured or analyzed; and at least one external test connecting contact point to which the signals to be measured or analyzed can be selectively applied such that the signals can be can be passed on via routes within the integrated circuit component from said plurality of circuit points that are not externally accessible.

The use of external test connecting contact points allow internal chip signals to be seen and the timing to be determined accurately. For this purpose, a reference signal is selectively applied such that it can be passed on via a route within the component to one of the external test connecting contact points from a circuit point which is not externally accessible, and in that signals which are to be measured or are to be analyzed can in each case be selectively applied such that they can be passed on via routes within the component to the other test connecting contact points from circuit points which are not externally accessible. The reference signal is thus made available in addition to the signal to be analyzed, in order to determine the signal response in the time domain. In order to allow internal-chip signals such as clock signals and asynchronous signals to be analyzed with accurate timing, at least two external test connecting contact points are thus provided according to the invention.

The inaccessible signals may thus be internal chip signals in the integrated circuit component, which is designed such that these signals, including the reference signals, can be selectively passed on to the external test connecting contact points.

However, the inaccessible signals may also be signals which occur at inaccessible contact points in the package of an integrated circuit component, in which case these signals, including reference signals are selectively passed on to the test connecting contact points, which are formed by particular ones of the contact points.

In this case, the integrated circuit component package is, in particular, a so-called BGA package (ball grid array package), in which those test connecting contact points which are provided by contact points (balls) are inaccessible, since the contact points are located on the lower face of the package and are thus concealed between the package and a system board on which the package is fitted. In this case the special contact points to which those signals which are to be measured and are to be analyzed, as well as the reference signals, which are likewise present at other contact points, are selectively passed on, and are electrically conductively connected to a corresponding number of metallic test points on the system board.

One or more contact points are thus defined in the BGA package, whose signals are seen at test points on the customer-specific system board. The signals from all the other contact points in the integrated circuit component can be seen at these contact points.

In accordance with an added feature of the invention, a time-controlled multiplexing circuit is provided for selectively passing on signals in the integrated circuit component. The multiplexing circuit enables the various signals which are to be measured and are to be analyzed and, if appropriate, the respective reference signals, to be passed on to the external test connecting contact points. If the time-controlled multiplexing circuit is provided in an integrated circuit component surrounded by a BGA package, then those contact points which are not used as test connecting contact points are electrically conductively connected to inputs of the multiplexing circuit, whose outputs are electrically conductively connected to those particular contact points in the BGA package which form the external test connecting contact points. All the contact point signals can then be multiplexed as required to the specific test contact points. In the past, one signal has always been uniquely associated with one contact point, or with a very small number of contact points.

In accordance with an additional feature of the invention, the control of the multiplexing circuit, which predetermines the selective passing on of signals to the test connecting contact points, is programmable. This allows the multiplexing circuit to be programmed as required, even during operation.

In accordance with another feature of the invention, a component tester, can be used to analyze the integrated circuit component, and to which those signals which are respectively present at the test connecting contact points are applied for analysis.

In accordance with a further feature of the invention, the integrated circuit component can be directly analyzed in an application within a system, in which the signals which are present at the test connecting contact points are measured and analyzed. In this case, it is also possible to analyze the system in which the integrated circuit component is used.

In accordance with another added feature of the invention, the test connecting contact points can also be used in the opposite operating direction for inputting signals to those circuit points which are not externally accessible in the integrated circuit component (input mode).

With the foregoing and other objects in view there is provided, in accordance with the invention, an integrated circuit component that includes a package; a plurality of contact points for connection to an external component and disposed on said package; a test contact point for connection to the external component and disposed on said package; and a multiplexer having an output connected to said test contact point and having a plurality of inputs, each one of said plurality of inputs connected to a respective one of said plurality of contact points.

Other features which are considered as characteristic for the invention are set forth in the appended claims.

Although the invention is illustrated and described herein as embodied in a device for measurement and analysis of electrical signals of an integrated circuit component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
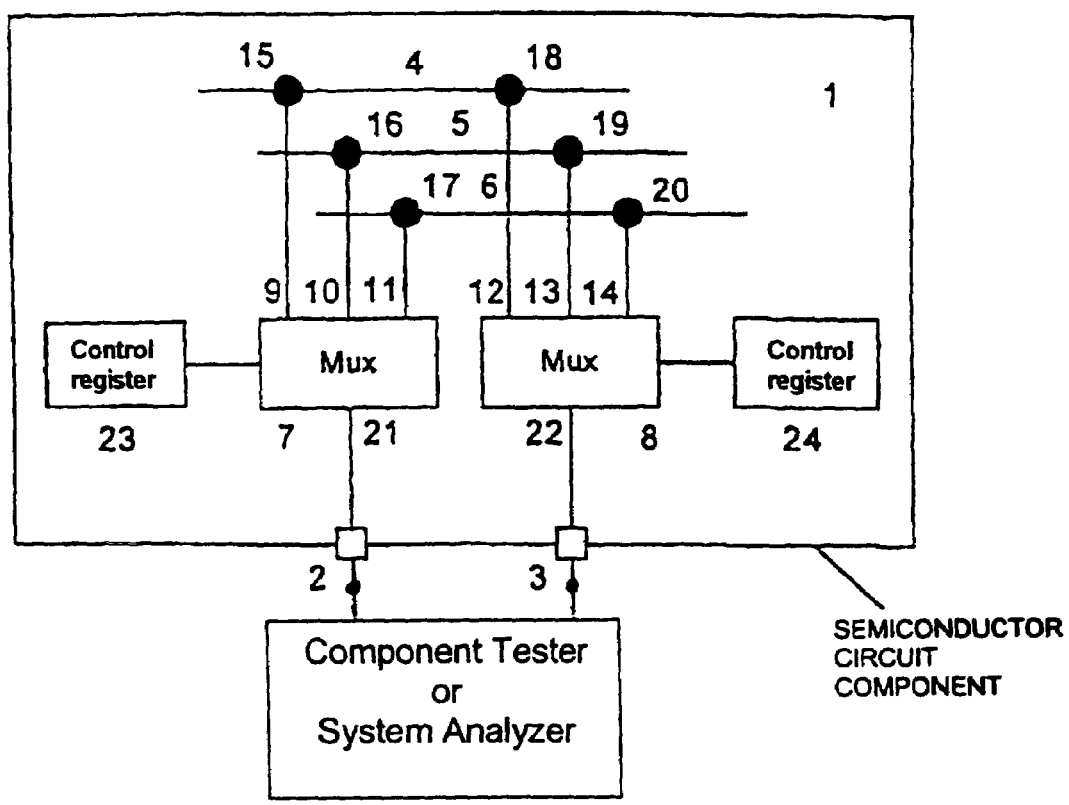
FIG. 1 shows a schematic illustration of an integrated electrical semiconductor circuit component (chip) having two external test connecting contact points (pins) via which the internal chip signals can be monitored.

Referring now to the figures of the drawing in detail and first, particularly, to FIG. 1 thereof, there is schematically shown an integrated semiconductor circuit component (chip) 1. The integrated semiconductor circuit component 1 has two external test connecting contact points (pins) 2 and 3 via which internal-chip signals 4, 5 and 6 can be monitored with accurate timing, that is to say signals which are present at circuit points that are not directly accessible. For example, clocks can be measured with respect to one another, asynchronous signals such as interrupts can be measured, or functions can be analyzed as a function of asynchronous signals. The integrated circuit component 1 therefore has two external connecting contact points 2 and 3, since the goal is to determine the timing accurately.

For such a determination process, in addition to the signal to be analyzed, at one of the test connecting contact points 2 and 3, a reference signal is available at the respective other test connecting contact point. It follows from this that there must be at least two test connecting contact points 2 and 3 for internal-chip signals 4, 5 and 6 to be analyzed with accurate timing. Two multiplexers 7 and 8 are provided as a multiplexing circuit for selectively passing on the internal chip signals 4, 5 or 6, and their inputs 9, 10, 11 and 12, 13, 14, respectively, are connected to the internal-chip points 15, 16, 17 and 18, 19, 20, respectively, which carry the signals. The outputs 21 and 22 of the two multiplexers 7 and 8, respectively, are electrically connected to the two external test connecting contact points (pins) 2 and 3, respectively.

The process of passing on the signals from the two multiplexers 7 and 8 which may, for example, be logic devices or tristate devices, is in each case controlled by a control register 23 or 24, respectively, which can be programmed via a controller, a digital signal processor or a tap controller during operation.

Figure 2:
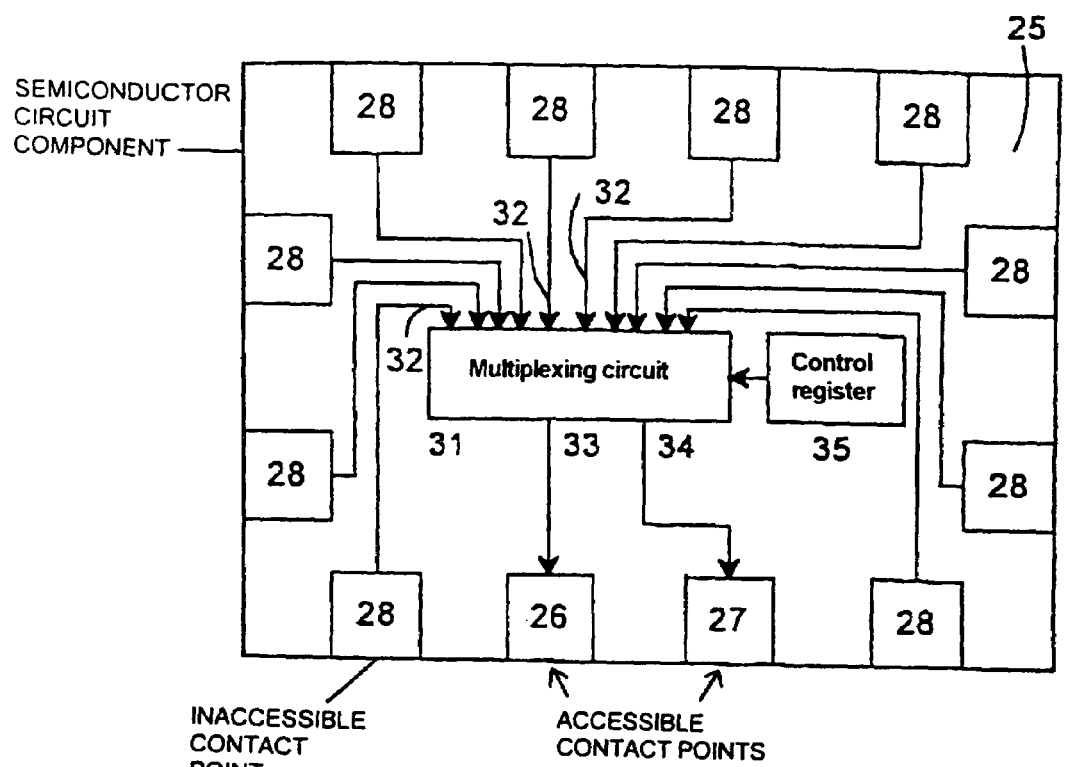
FIG. 2 shows, likewise schematically, an illustration of an electrical semiconductor chip having two external test pads, via which signals from other pads, which are inaccessible after installation, in BGA package can be monitored.
Figure 4A:
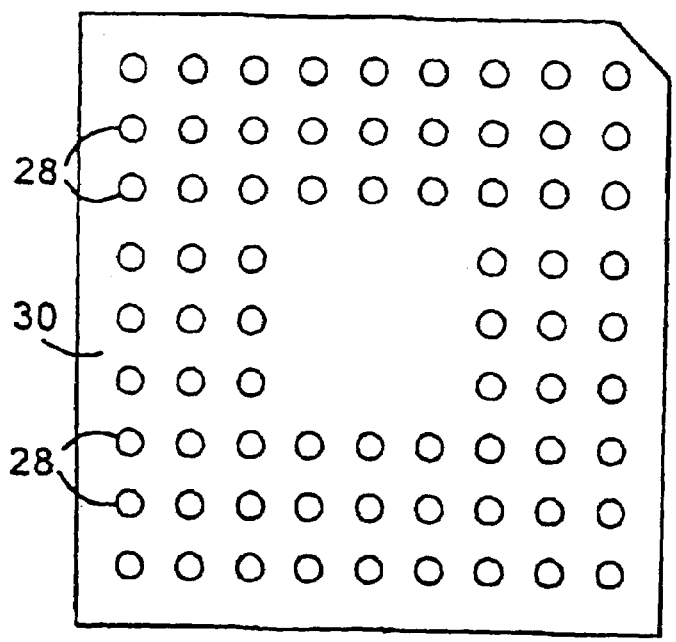
FIGS. 4a, 4b and 4c respectively show a view from underneath, from the side and from above a BGA package (plastic thin flat ball grid array).
Figure 4B:
Figure 4C:
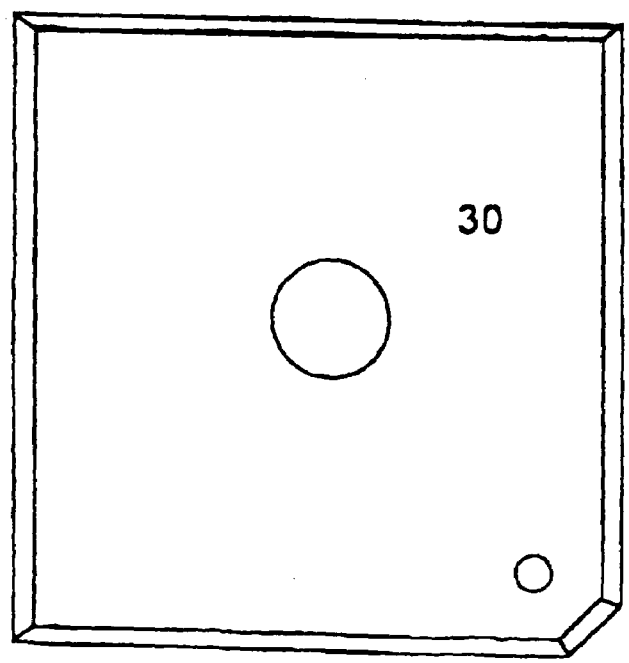

FIG. 2 shows, likewise schematically, an integrated electrical semiconductor circuit component (chip) 25 having two test contact points (test pads; test balls) 26 and 27 which form external test connecting contact points, via which the signals from other contact points (pads; balls) 28, which are not accessible after installation, in a BGA package can be monitored. As shown in three different views in FIGS. 4a, 4b and 4c, the contact points 28 to the system board 29 are not accessible, since the contact points 28 are located on the lower face of the package 30, and are thus concealed between the housing 30 and the system board 29.

The signals can thus not be tapped off at the contact points 28 for test and analysis purposes. As shown in FIG. 2, a multiplexing circuit 31 is provided for selectively passing on the signals which are present at the contact points 28, and its inputs 32 are connected to the individual contact points 28.

The outputs 33 and 34 of the multiplexing circuit 31 are electrically connected to the two external test contact points (test balls) 26 and 27, respectively. The process of passing on the signals from the multiplexing circuit 31 which, for example, may be in the form of a logic device or tristate device, is controlled by a control register 35, which can be programmed via a controller, a digital signal processor or a tap controller during operation.

Figure 3:
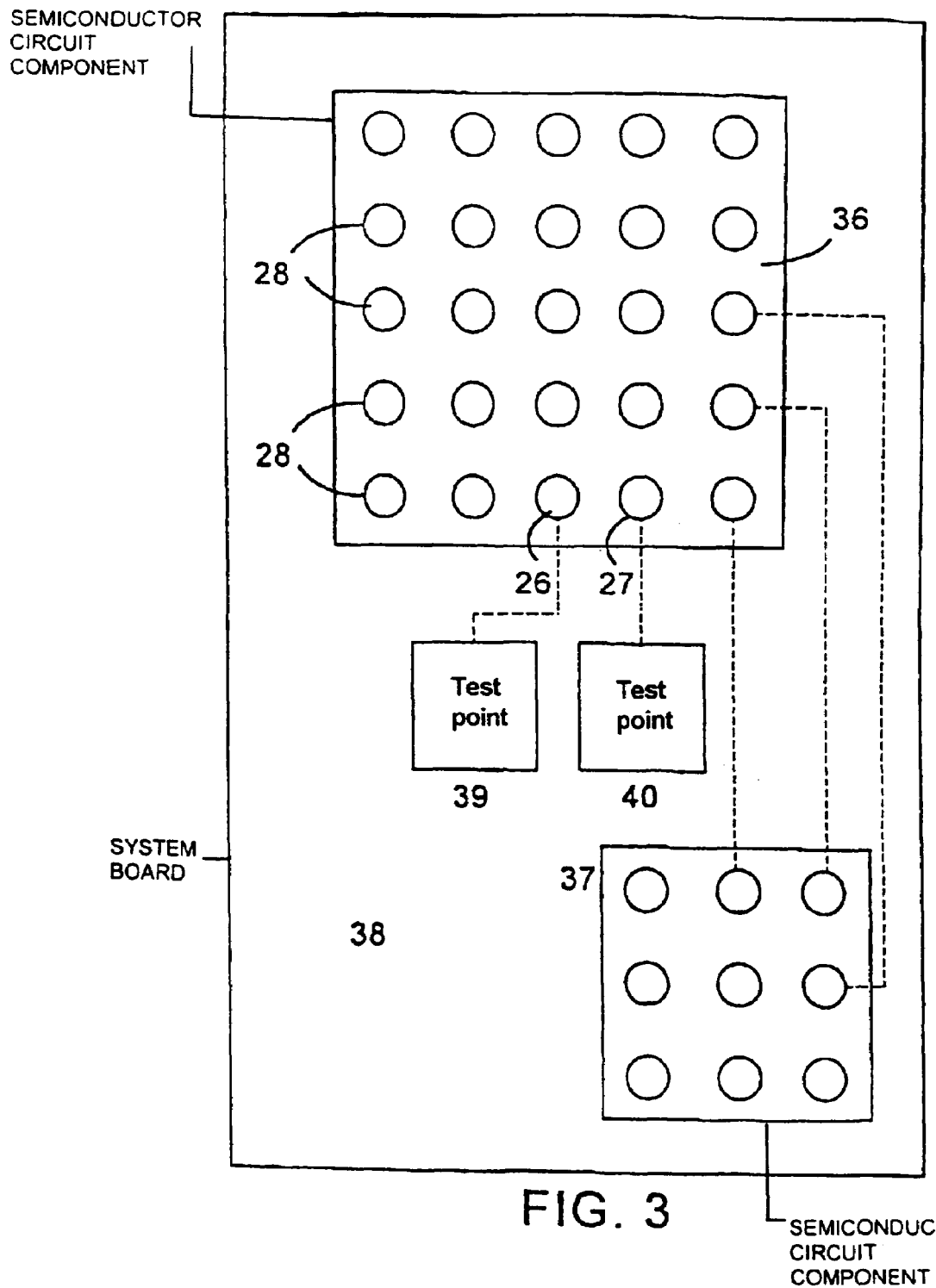
FIG. 3 shows a schematic view of electrical semiconductor chips mounted in a BGA package in an overall system.

FIG. 3 shows a schematic view of integrated semiconductor circuit components 36 and 37 which are each mounted in a BGA package in an overall system, which is fitted on a customer-specific system board 38. Two metallic test points 39 and 40 are fitted on the system board 38, and are electrically connected to the two test contact points 26 and 27. The signals from the two balls, which are defined as test contact points 26 and 27, in the integrated semiconductor circuit component 36 can be seen at the two test points 39 and 40 on the system board 38.

The signals from all the other contact points 28 in the integrated circuit component 36 can be seen at these two contact points 26 and 27, and thus at the test points 39 and 40. The process of selectively passing on the individual signals in a controlled manner from all the contact points 28 to the test contact points 26 and 27, respectively, is carried out, as shown in FIG. 1, by means of the multiplexing circuit 31.

An integrated circuit component according to the present invention includes a plurality of connecting contact points, a plurality of circuit points that are not externally accessible and that provide electrical signals to be measured or analyzed, and at least one external test connecting contact point to which the signals to be measured or analyzed can be selectively applied such that the signals can be passed on via routes within the integrated circuit component from the plurality of circuit points that are not externally accessible.

In accordance with another feature of the invention, the at least one external test connecting contact point is a plurality of external test connecting contact points, a reference signal is selectively applied and passed on via a route within the integrated circuit component to one of the plurality of external test connecting contact points from one of the plurality of circuit points that are not externally accessible, and the signals to be measured or analyzed can be selectively applied to be passed on via routes within the integrated circuit component from the plurality of circuit points that are not externally accessible to the plurality of external test connecting contact points other than the one of the plurality of external test connecting contact points.

In accordance with a further feature of the invention, the plurality of external test connecting contact points is exactly two external test connecting contact points.

In accordance with an added feature of the invention, the electrical signals are internal chip signals in the integrated circuit component and reference signals and the electrical signals can be selectively passed on to the at least one external test connecting contact point.

In accordance with an additional feature of the invention, there is provided a package and the plurality of connecting contact points define a plurality of inaccessible contact points disposed on the package, the electrical signals at the plurality of circuit points that are not externally accessible are present at the plurality of inaccessible contact points, the electrical signals and reference signals are selectively passed on to the at least one external test connecting contact point, and the at least one external test connecting contact point is formed by at least one of the plurality of inaccessible contact points.

In accordance with yet another feature of the invention, the package is a ball grid array package having a lower face, the plurality of inaccessible contact points are located on the lower face of the package and are thus concealed between the package and a system board on which the package is fitted, and the at least one external test connecting contact point is electrically conductively connected to a corresponding number of metallic test points on the system board.

In accordance with yet a further feature of the invention, a time-controlled multiplexing circuit is provided for selectively passing on the electrical signals to the at least one external test connecting contact point.

In accordance with yet an added feature of the invention, the time-controlled multiplexing circuit has inputs and an output and is provided in the integrated circuit component which is surrounded by a ball grid array package, the plurality of contact points which are not used as external test connecting contact points are electrically conductively connected to the inputs of the multiplexing circuit, and the output of the time-controlled multiplexing circuit is electrically conductively connected to one of the plurality of contact points in the package which forms the at least one external test connecting contact point.

In accordance with yet an additional feature of the invention, the multiplexing circuit is programmably controlled to predetermine selective passing on of the electrical signals to the at least one external test connecting contact point.

In accordance with again another feature of the invention, the at least one external test connecting contact point can be selectively used in an opposite operating direction for inputting signals to the plurality of circuit points that are not externally accessible.

In accordance with again a further feature of the invention, the at least one external test connecting contact point is connected to a component tester for analyzing the electrical signals at, at least some of the plurality of circuit points.

In accordance with again an added feature of the invention, the at least one external test connecting contact point is connected to a system and an application of the system analyzes the electrical signals at, at least some of the plurality of circuit points.

In accordance with again an additional feature of the invention, the at least one external test connecting contact point is used for analyzing a system in which the integrated circuit is used.

With the objects of the invention in view, there is also provided an integrated circuit component, including a package, a plurality of contact points for connection to an external component and disposed on the package, a test contact point for connection to the external component and disposed on the package, and a multiplexer having an output connected to the test contact point and having a plurality of inputs, each one of the plurality of inputs connected to a respective one of the plurality of contact points.

In accordance with still another feature of the invention, there are provided a first set of contact points defined by the plurality of contact points, a second set of contact points for connection to an external component and disposed on the package, a first test contact point defined by the test contact point, a second test contact point for connection to the external component and disposed on the package, a first multiplexer defined by the multiplexer, each one of the plurality of inputs connected to a respective one of the first set of the plurality of contact points, and a second multiplexer having an output connected to the second test contact point and having a plurality of inputs, each one of the plurality of inputs of the second multiplexer connected to a respective one of the second set of contact points.

In accordance with a concomitant feature of the invention, the package is a ball grid array package.

We claim:

1. An integrated circuit component, comprising:
    a plurality of circuit points not being directly externally accessible, providing a reference signal provided by the integrated circuit component for test purposes, and various electrical signals of the integrated circuit component to be monitored for test purposes;
    at least one connecting contact point being externally accessible; and
    a multiplexer having an output connected to said at least one connecting contact point and having a plurality of inputs, each one of said plurality of inputs being connected to a respective one of said plurality of circuit points, permitting external access to the reference signal and to the various electrical signals;
    wherein the reference signal applied to said at least one connecting contact point is a reference signal allowing a determination of a timing of the electrical signal applied to said at least one connecting contact point.

2. The integrated circuit component according to claim 1, wherein said at least one connecting contact point is one of a plurality of connecting contact points.

3. The integrated circuit component according to claim 2, wherein said plurality of connecting contact points is exactly two connecting contact points.

4. The integrated circuit component according to claim 1, wherein the electrical signals are internal chip signals in the integrated circuit component, and the reference signals are used for monitoring the timing of the internal chip signals.

5. The integrated circuit according to claim 1, comprising a package and wherein said plurality of contact points are disposed on said package.

6. The integrated circuit according to claim 3, wherein:
    said package is a ball grid array package having a lower face;
    said plurality of inaccessible contact points are located on said lower face of said package and are thus concealed between said package and a system board on which said package is fitted; and
    said at least one connecting contact point is electrically conductively connected to a corresponding number of metallic test points on the system board.

7. The integrated circuit component according to claim 3, further comprising a second multiplexing circuit.

8. The integrated circuit according to claim 1, wherein said multiplexer is time-controlled and is provided in the integrated circuit component surrounded by a ball grid array package.

9. The integrated circuit component according to claim 7, wherein said multiplexing circuit is programmably controlled to predetermine selective passing on of the electrical signals to said at least one connecting contact point.

10. The integrated circuit component according to claim 1, wherein said at least one connecting contact point can be selectively used in an opposite operating direction for inputting signals to said plurality of circuit points that are not externally accessible.

11. The integrated circuit according to claim 1, wherein said at least one connecting contact point is connected to a component tester for analyzing the electrical signals.

12. The integrated circuit component according to claim 1, wherein said at least one connecting contact point is connected to a system analyzer and an application of said system analyzer analyzes the electrical signals of at least some of said plurality of circuit points.

13. An integrated circuit component, comprising:
    a first plurality of circuit points of the integrated circuit component not being directly externally accessible, providing a reference signal provided by the integrated circuit component for test purposes;
    a second plurality of circuit points of the integrated circuit not being directly externally accessible, providing electrical signals of the integrated circuit component to be monitored for test purposes;
    a first connecting contact point being externally accessible;
    a second connecting contact point being externally accessible;
    a first multiplexer having an output connected to said first connecting contact point and having a plurality of inputs, each one of said plurality of inputs being connected to a respective one of said first plurality of circuit points, permitting external access to the reference signal;
    a second multiplexer having an output connected to said second connecting contact point and having a plurality of inputs, each one of said plurality of inputs being connected to a respective one of said second plurality of circuit points, permitting external access to the various electrical signals;
    wherein the reference signal applied to said first connecting contact point is a reference signal allowing a determination of a timing of the electrical signal applied to said second connecting contact point.

* * * * *

UNITED STATES PATENT AND TRADEMARK OFFICE
CERTIFICATE OF CORRECTION

| | | |
|---|---|---|
| PATENT NO. | : 7,239,162 B2 | Page 1 of 1 |
| APPLICATION NO. | : 11/028728 | |
| DATED | : July 3, 2007 | |
| INVENTOR(S) | : Wilhelm Schmid et al. | |

It is certified that error appears in the above-identified patent and that said Letters Patent is hereby corrected as shown below:

Title Page, Item (60) should read as follows:

(60) Division of application No. 09/740,634, filed on Dec. 18, 2000, now Pat. No. 6,949,940, which is a continuation of application No. PCT/DE99/01719, filed on Jun. 11, 1999.

Column 1,

Lines 7-17, should read:

This is a division of copending application No. 09/740,634, filed Dec. 18, 2000, now Pat, No. 6,949,940; which was a continuing application, under 35 U.S.C. § 120, of International application PCT/DE99/01719, filed Jun. 11, 1999; the application also claims the priority, under 35 U.S.C. §119, of German patent application No. 198 26 825. 4, filed Jun. 16, 1998; the prior applications are herewith incorporated by reference in their entirety.

Signed and Sealed this

Eighteenth Day of September, 2007

JON W. DUDAS
*Director of the United States Patent and Trademark Office*